(12) United States Patent
Fan

(10) Patent No.: US 11,444,266 B2
(45) Date of Patent: Sep. 13, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Guangbao Fan, Wuhan (CN)

(*) Notice: Subject to any disclaimer, the term of this patent is extended or adjusted under 35 U.S.C. 154(b) by 607 days.

(21) Appl. No.: 16/343,779

(22) PCT Filed: Jan. 14, 2019

(86) PCT No.: PCT/CN2019/071556
§ 371 (c)(1),
(2) Date: Apr. 22, 2019

(87) PCT Pub. No.: WO2020/118838
PCT Pub. Date: Jun. 18, 2020

(65) Prior Publication Data
US 2021/0359270 A1    Nov. 18, 2021

(30) Foreign Application Priority Data
Dec. 13, 2018 (CN) ......................... 201811527452.X

(51) Int. Cl.
*H01L 51/52* (2006.01)
*H01L 27/32* (2006.01)

(52) U.S. Cl.
CPC ...... *H01L 51/5259* (2013.01); *H01L 51/5253* (2013.01); *H01L 27/3244* (2013.01)

(58) Field of Classification Search
CPC ............. H01L 51/5253; H01L 51/5259; H01L 27/3244; H01L 51/5256; H01L 51/5237; H01L 51/5246
USPC ........................................ 257/40; 438/82, 99
See application file for complete search history.

(56) References Cited

U.S. PATENT DOCUMENTS

| 7,948,176 B2 | 5/2011 | Oh et al. |
| 2010/0173555 A1 | 7/2010 | Nishi et al. |
| 2013/0240848 A1 | 9/2013 | Lin |
| 2015/0372256 A1 | 12/2015 | Jiao et al. |
| 2016/0365395 A1* | 12/2016 | Xu et al. ............. H01L 27/3244 257/40 |
| 2019/0067629 A1 | 2/2019 | Wu |

FOREIGN PATENT DOCUMENTS

| CN | 103325953 A | 9/2013 |
| CN | 206282861 U | 6/2017 |
| CN | 106981584 A | 7/2017 |

(Continued)

*Primary Examiner* — Thinh T Nguyen

(57) ABSTRACT

Provided are a display panel and a display device. The display panel includes a substrate; an organic light emitting element, disposed on the substrate; a plurality of barrier pillars, wherein the plurality of barrier pillars are disposed on the substrate, and the plurality of barrier pillars are disposed around the organic light emitting device; a water absorbing layer, wherein the water absorbing layer is disposed on the substrate, and the water absorbing layer is disposed around the plurality of barrier pillars; and a thin film encapsulation layer, disposed on the organic light emitting device, the substrate, the plurality of barrier pillars and the water absorbing layer.

16 Claims, 2 Drawing Sheets

(56) References Cited

FOREIGN PATENT DOCUMENTS

| | | |
|---|---|---|
| CN | 107123744 A | 9/2017 |
| CN | 107425136 A | 12/2017 |
| CN | 107565066 A | 1/2018 |
| CN | 107644946 A | 1/2018 |
| CN | 108075049 A | 5/2018 |
| CN | 108198837 A | 6/2018 |
| CN | 108598286 A | 9/2018 |
| CN | 108832016 A | 11/2018 |
| CN | 109728164 A | 5/2019 |
| JP | 2010244697 A | 10/2010 |
| KR | 20180074145 A | 7/2018 |

* cited by examiner

DISPLAY PANEL AND DISPLAY DEVICE

FIELD OF THE INVENTION

The present invention relates to a display technology field, and more particularly to a display panel and a display device.

BACKGROUND OF THE INVENTION

In the field of display technology, OLED (Organic Light-emitting Diode) displays are widely used because of properties of light weight, self-illumination, wide view angle and quick response.

In the OLED display, in order to strictly eliminate the erosion of the external water vapor, a thin film encapsulation method is generally adopted, that is, a thin film encapsulation layer is provided. Due to the ductility during the formation of the thin film encapsulation layer, in order to avoid an increase of the ineffective area around the OLED device caused by the extension of the thin film encapsulation layer, as shown in FIG. 1, two circles of barrier pillars 22 may be disposed around the organic light emitting device 21. However, the encapsulation film 23 located on the left side of the barrier pillar 22 is easily collapsed and broken due to a large slop, which causes intrusion of water vapor and damages the OLED panel 2.

SUMMARY OF THE INVENTION

An object of the present invention is to provide a display panel and a display device which can prevent intrusion of moisture and can improve a yield of the display panel.

The embodiment of the present invention provides a display panel, including:

a substrate;

an organic light emitting device, disposed on the substrate;

a plurality of barrier pillars, wherein the plurality of barrier pillars are disposed on the substrate, and the plurality of barrier pillars are disposed around the organic light emitting device;

a water absorbing layer, wherein the water absorbing layer is disposed on the substrate, and the water absorbing layer is disposed around the plurality of barrier pillars; and a thin film encapsulation layer, disposed on the organic light emitting device, the substrate, the plurality of barrier pillars and the water absorbing layer.

In some embodiments, the plurality of barrier pillars are two circles of barrier pillars disposed around the organic light emitting device; and the water absorbing layer is disposed between the two circles of barrier pillars, or the water absorbing layer is disposed around the two circles of barrier pillars.

In some embodiments, a height of the barrier pillars adjacent to an edge region of the display panel is smaller than a height of the barrier pillars away from the edge region of the display panel.

In some embodiments, the barrier pillars include a body and a water absorbing film layer disposed on the body.

In some embodiments, constituent materials of the water absorbing layer include an organic water absorbing material and/or an inorganic water absorbing material.

In some embodiments, the inorganic water absorbing material includes calcium carbonate, and the organic water absorbing material includes a resin and/or an acrylate.

In some embodiments, constituent materials of the water absorbing layer include an epoxy resin, an acrylic resin and a curing agent.

In some embodiments, a height of the water absorbing layer is less than heights of the barrier pillars.

In some embodiments, the height of the water absorbing layer ranges from 0.1 micron to 0.3 micron.

In some embodiments, the thin film encapsulation layer includes:

a first thin film encapsulation layer, disposed on the substrate, the organic light emitting device and the barrier pillars;

a second thin film encapsulation layer, disposed on the first thin film encapsulation layer, wherein the second thin film encapsulation layer is also disposed on a side of the barrier pillars adjacent to the organic light emitting device; and a third thin film encapsulation layer, disposed on the first thin film encapsulation layer, the second thin film encapsulation layer and the water absorbing layer.

The embodiment of the present invention further provides a display device, including a display panel;

wherein the display panel includes:

a substrate;

an organic light emitting device, disposed on the substrate;

a plurality of barrier pillars, wherein the plurality of barrier pillars are disposed on the substrate, and the plurality of barrier pillars are disposed around the organic light emitting device;

a water absorbing layer, wherein the water absorbing layer is disposed on the substrate, and the water absorbing layer is disposed around the plurality of barrier pillars; and a thin film encapsulation layer, disposed on the organic light emitting device, the substrate, the plurality of barrier pillars and the water absorbing layer.

In some embodiments, the plurality of barrier pillars are two circles of barrier pillars disposed around the organic light emitting device; and the water absorbing layer is disposed between the two circles of barrier pillars, or the water absorbing layer is disposed around the two circles of barrier pillars.

In some embodiments, a height of the barrier pillars adjacent to an edge region of the display panel is smaller than a height of the barrier pillars away from the edge region of the display panel.

In some embodiments, the barrier pillars include a body and a water absorbing film layer disposed on the body.

In some embodiments, constituent materials of the water absorbing layer include an organic water absorbing material and/or an inorganic water absorbing material.

In some embodiments, the inorganic water absorbing material includes calcium carbonate, and the organic water absorbing material includes a resin and/or an acrylate.

In some embodiments, constituent materials of the water absorbing layer include an epoxy resin, an acrylic resin and a curing agent.

In some embodiments, a height of the water absorbing layer is less than heights of the barrier pillars.

In some embodiments, the height of the water absorbing layer ranges from 0.1 micron to 0.3 micron.

In some embodiments, the thin film encapsulation layer includes:

a first thin film encapsulation layer, disposed on the substrate, the organic light emitting device and the barrier pillars;

a second thin film encapsulation layer, disposed on the first thin film encapsulation layer, wherein the second thin film encapsulation layer is also disposed on a side of the barrier pillars adjacent to the organic light emitting device; and a third thin film encapsulation layer, disposed on the first thin film encapsulation layer, the second thin film encapsulation layer and the water absorbing layer.

Compared with the display panel and the display device of the prior art, the display panel and the display device of the present invention can absorb external water vapor when the thin film encapsulation layer is broken by providing the water absorbing layer, thereby improving the yield of the display panel.

BRIEF DESCRIPTION OF THE DRAWINGS

For a better understanding of the aforementioned content of the present invention, preferable embodiments are illustrated in accordance with the attached figures for further explanation.

DETAILED DESCRIPTION OF PREFERRED EMBODIMENTS

Figure 1:
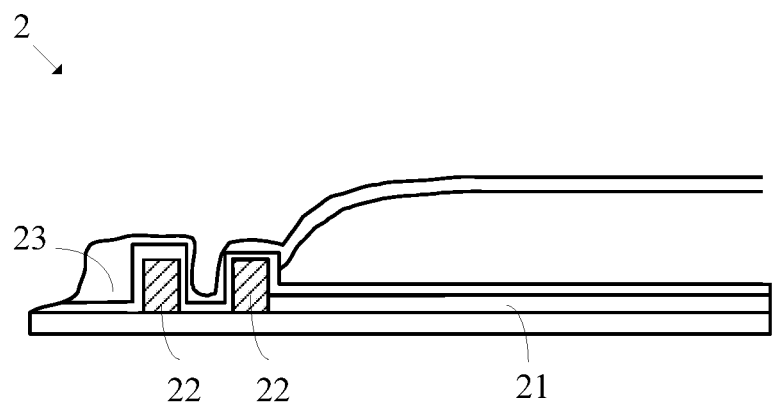
FIG. 1 is a structural diagram of a display panel according to the prior art.

The following descriptions for the respective embodiments are specific embodiments capable of being implemented for illustrations of the present invention with referring to appended figures. The terms of up, down, front, rear, left, right, interior, exterior, side, etcetera mentioned in the present invention are merely directions of referring to appended figures. Thus, the used directional terms are used to describe and understand the present invention, but the present invention is not limited thereto.

In the figure, units with similar structures are denoted by the same reference numerals.

Reference in this specification to "embodiment" means that a particular feature, structure, or characteristic described in connection with the embodiment is included in at least one embodiment of the present invention. Appearances of the phrase "embodiment" in various places in the specification do not necessarily refer to the same embodiment, nor are separate or alternative embodiments mutually exclusive of other embodiments. Those skilled in the art implicitly and explicitly understand that the embodiments described herein may be combined with other embodiments.

Figure 2:
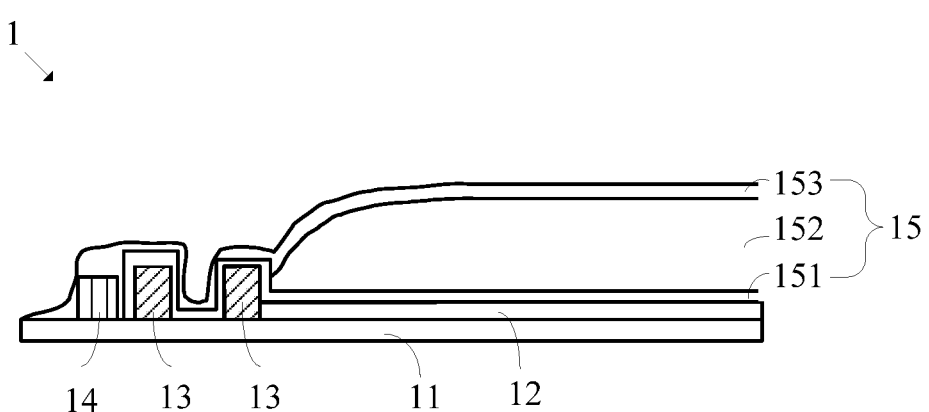
FIG. 2 is a first structural diagram of a display panel according to an embodiment of the present invention.

The embodiment of the present invention provides a display device. The display device includes a display panel. Please refer to FIG. 2. FIG. 2 is a first structural diagram of a display panel according to an embodiment of the present invention. The display panel 1 includes a substrate 11, an organic light emitting device 12, a plurality of barrier pillars 13, a water absorbing layer 14 and a thin film encapsulation layer 15.

The substrate 11 is used to carry the organic light emitting device 12 disposed thereon. In one embodiment, the substrate 11 may be a flexible substrate composed of a flexible material such as polyimide, polycarbonate, polyether sulfone, polyethylene terephthalate, polyethylene naphthalate or polyarylate. A thin film transistor layer may also be disposed on the substrate 11.

The organic light emitting device 12 may include two layers of electrodes and an organic light emitting layer sandwiched between the two layers of electrodes. The organic light emitting device 12 may be a bottom light emitting type device or an top light emitting type device.

Figure 3:
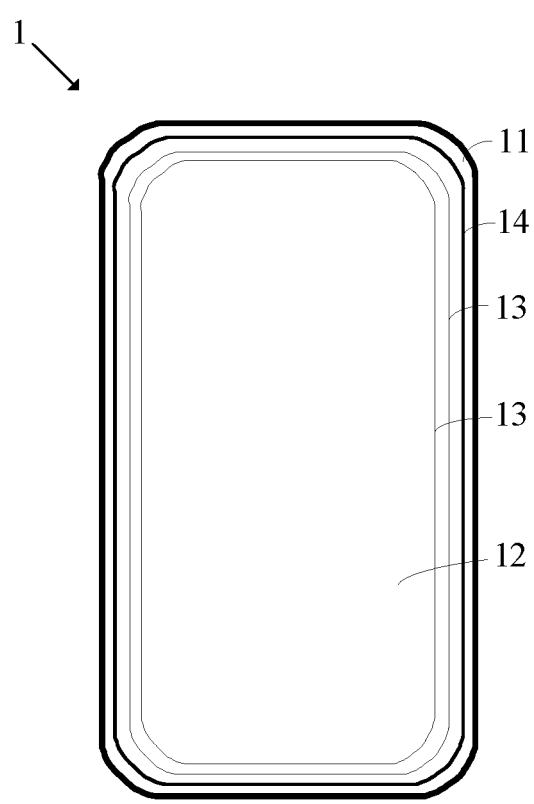
FIG. 3 is a second structural diagram of a display panel according to an embodiment of the present invention.

As shown in FIG. 2 and FIG. 3, the plurality of barrier pillars 13 are disposed on the substrate 11 and disposed around the organic light emitting device 12. The barrier pillars 13 are located in a non-display area of the display panel 1, which can block overflow of the thin film encapsulation layer 15.

In one embodiment, in order to prevent the film encapsulation layer 15 in an edge region of the display panel 1 from being excessively steep, two circles of the barrier pillars 13 distributed around the organic light emitting device 12 may be disposed. Specifically, a circle number of the barrier pillars 13 can be set in the edge region of the display panel 1 in accordance with a shape of the thin film encapsulation layer 15, which is not specifically limited herein.

When more than one circles of the barrier pillars 13 are provided in the display panel 1, a height of the barrier pillars 13 adjacent to the edge region of the display panel 1 can be sequentially reduced. Namely, the closer the barrier pillars 13 are from the edge region of the display panel 1, the smaller the height is. This can smoothly reduce the slope of the thin film encapsulation layer 15 in the edge region of the display panel 1 and can reduce the possibility of breakage.

In one embodiment, the barrier pillars 13 include a body and a water absorbing film layer disposed on the body. The body may be made of a photoresist material, and the water absorbing film layer may be made of a material having water absorbing properties, for instance, an organic water absorbing material, such a resin or an acrylate and/or an inorganic water absorbing material, such as calcium carbonate.

The water absorbing layer 14 is disposed on the substrate 11, and the water absorbing layer 14 can effectively absorb moisture invaded from the outside when the film encapsulation layer 15 is broken.

In one embodiment, regardless of whether the barrier pillars 13 are arranged in one circle or multiple circles, the water absorbing layer 14 may be disposed at periphery of all the barrier pillars 13, that is, disposed around all the barrier pillars 13. Then, the height of the water absorbing layer 14 may be set to be smaller than the height of the barrier pillars 13, which can smoothly reduce the slope of the thin film encapsulation layer 15 in the edge region of the display panel 1 and can reduce the possibility of breakage.

In one embodiment, the height of the water absorbing layer 14 may range from 0.1 micron to 0.3 micron. Thus, the water absorbing layer 14 can also function to assist in supporting the thin film encapsulation layer 15.

In one embodiment, in case that the barrier pillars 13 are provided in two circles, the water absorbing layer 14 may be disposed at a position between the two circles of the barrier pillars 13.

In one embodiment, constituent materials of the water absorbing layer 14 includes an organic water absorbing material or an inorganic water absorbing material. Namely, the water absorbing layer 14 may be made of an inorganic water absorbing material, an inorganic water absorbing material or a combination of both. In one embodiment, the inorganic water absorbing material may include calcium carbonate, and the organic water absorbing material may include a resin and/or an acrylate.

The water absorbing layer 14 may be spaced apart from the barrier pillars 13. Specifically, the foregoing water absorbing layer 14 can be formed by inkjet printing with acrylate. Alternatively, the foregoing water absorbing layer 14 may be formed with an epoxy resin, an acrylic resin and a curing agent.

The thin film encapsulation layer 15 may include a multilayer film structure. As shown in FIG. 2, the thin film encapsulation layer 15 includes a first thin film encapsulation layer 151, a second thin film encapsulation layer 152 and a third thin film encapsulation layer 153. The first thin film encapsulation layer 151 and the third thin film encapsulation layer 153 may be inorganic thin film layers, and the second thin film encapsulation layer 152 may be an organic thin film layer. Specifically, a CVD (chemical vapor deposition) process may be performed on the substrate 11, the organic light emitting device 12 and the barrier pillars 13 to form the first thin film encapsulation layer 151. Then, an inkjet printing process is performed on the first film encapsulation layer 151 to form the second thin film encapsulation layer 152. The second thin film encapsulation layer 152 is also disposed on a side of the barrier pillars 13 adjacent to the organic light emitting device 12. Finally, a CVD process is performed on the second thin film encapsulation layer 152, the first thin film encapsulation layer 151 and the water absorbing layer 14 to form the third thin film encapsulation layer 153.

The display panel and the display device of the present invention can absorb external water vapor when the thin film encapsulation layer is broken by providing the water absorbing layer, thereby improving the yield of the display panel.

In summary, although the above preferred embodiments of the present invention are disclosed, the foregoing preferred embodiments are not intended to limit the invention, those skilled in the art can make various kinds of alterations and modifications without departing from the spirit and scope of the present invention. Thus, the scope of protection of the present invention is defined by the scope of the claims.

What is claimed is:

1. A display panel, including:
   a substrate;
   an organic light emitting device, disposed on the substrate;
   a plurality of barrier pillars, wherein the plurality of barrier pillars are disposed on the substrate, and the plurality of barrier pillars are disposed around the organic light emitting device;
   a water absorbing layer, wherein the water absorbing layer is disposed on the substrate, and the water absorbing layer is disposed to surround one of the plurality of barrier pillars farthest from the organic light emitting device, and a height of the water absorbing layer is less than heights of the plurality of barrier pillars and the height of the water absorbing layer ranges from 0.1 microns to 0.3 microns; and
   a thin film encapsulation layer, disposed on the organic light emitting device, the substrate, the plurality of barrier pillars and the water absorbing layer.

2. The display panel according to claim 1, wherein the plurality of barrier pillars are two circles of barrier pillars disposed around the organic light emitting device; and
   the water absorbing layer is disposed around one circle of barrier pillars farthest from the organic light emitting device.

3. The display panel according to claim 2, wherein a height of the barrier pillars adjacent to an edge region of the display panel is smaller than a height of the barrier pillars away from the edge region of the display panel.

4. The display panel according to claim 1, wherein the barrier pillars include a body and a water absorbing film layer disposed on the body.

5. The display panel according to claim 1, wherein constituent materials of the water absorbing layer includes an organic water absorbing material and/or an inorganic water absorbing material.

6. The display panel according to claim 3, wherein the inorganic water absorbing material includes calcium carbonate, and the organic water absorbing material includes a resin and/or an acrylate.

7. The display panel according to claim 1, wherein constituent materials of the water absorbing layer include an epoxy resin, an acrylic resin and a curing agent.

8. The display panel according to claim 1, wherein the thin film encapsulation layer includes:
   a first thin film encapsulation layer, disposed on the substrate, the organic light emitting device and the barrier pillars;
   a second thin film encapsulation layer, disposed on the first thin film encapsulation layer, wherein the second thin film encapsulation layer is also disposed on a side of the barrier pillars adjacent to the organic light emitting device; and
   a third thin film encapsulation layer, disposed on the first thin film encapsulation layer, the second thin film encapsulation layer and the water absorbing layer.

9. A display device, including a display panel;
   wherein the display panel includes:
   a substrate,
   an organic light emitting device, disposed on the substrate;
   a plurality of barrier pillars, wherein the plurality of barrier pillars are disposed on the substrate, and the plurality of barrier pillars are disposed around the organic light emitting device;
   a water absorbing layer, wherein the water absorbing layer is disposed on the substrate, and the water absorbing layer is disposed to surround one of the plurality of barrier pillars farthest from the organic light emitting device, and a height of the water absorbing layer is less than heights of the plurality of barrier pillars and ranges from 0.1 micron to 0.3 micron; and
   a thin film encapsulation layer, disposed on the organic light emitting device, the substrate, the plurality of barrier pillars and the water absorbing layer.

10. The display device according to claim 9,
    wherein the plurality of barrier pillars are two circles of barrier pillars disposed around the organic light emitting device; and
    the water absorbing layer is disposed around one circle of barrier pillars farthest from the organic light emitting device.

11. The display device according to claim 10, wherein a height of the barrier pillars adjacent to an edge region of the display panel is smaller than a height of the barrier pillars away from the edge region of the display panel.

12. The display device according to claim 9, wherein the barrier pillars include a body and a water absorbing film layer disposed on the body.

13. The display device according to claim 9, wherein constituent materials of the water absorbing layer includes an organic water absorbing material and/or an inorganic water absorbing material.

14. The display device according to claim 13, wherein the inorganic water absorbing material includes calcium carbonate, and the organic water absorbing material includes a resin and/or an acrylate.

15. The display device according to claim 9, wherein constituent materials of the water absorbing layer include an epoxy resin, an acrylic resin and a curing agent.

16. The display device according to claim 9, wherein the thin film encapsulation layer includes:
- a first thin film encapsulation layer, disposed on the substrate, the organic light emitting device and the barrier pillars;
- a second thin film encapsulation layer, disposed on the first thin film encapsulation layer, wherein the second thin film encapsulation layer is also disposed on a side of the barrier pillars adjacent to the organic light emitting device; and
- a third thin film encapsulation layer, disposed on the first thin film encapsulation layer, the second thin film encapsulation layer and the water absorbing layer.

* * * * *